(12) United States Patent
Bajaj et al.

(10) Patent No.: US 9,589,635 B2
(45) Date of Patent: Mar. 7, 2017

(54) SEMICONDUCTOR DEVICE WITH A STOICHIOMETRIC GRADIENT

(71) Applicant: International Business Machines Corporation, Armonk, NY (US)

(72) Inventors: Mohit Bajaj, Bangalore (IN); Geoffrey W. Burr, Cupertino, CA (US); Kota V. R. M. Murali, Bangalore (IN); Rajan K. Pandey, Bangalore (IN); Rajesh Sathiyanarayanan, Bangalore (IN); Kumar R. Virwani, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 124 days.

(21) Appl. No.: 14/567,499

(22) Filed: Dec. 11, 2014

(65) Prior Publication Data

US 2016/0172420 A1   Jun. 16, 2016

(51) Int. Cl.
  *H01L 27/24* (2006.01)
  *G11C 13/00* (2006.01)
  *H01L 45/00* (2006.01)
(52) U.S. Cl.
  CPC ........ *G11C 13/004* (2013.01); *H01L 27/2409* (2013.01); *H01L 27/2436* (2013.01); *H01L 45/06* (2013.01); *H01L 45/1233* (2013.01); *H01L 45/1253* (2013.01); *H01L 45/144* (2013.01); *H01L 45/16* (2013.01)
(58) Field of Classification Search
  CPC .............. H01L 27/2463; G11C 13/004; G11C 13/0007
  See application file for complete search history.

(56) References Cited

U.S. PATENT DOCUMENTS

| | | | |
|---|---|---|---|
| 5,888,891 A | 3/1999 | Gould | |
| 7,898,082 B2 | 3/2011 | Moon | |
| 8,319,203 B2 | 11/2012 | Hampton | |
| 8,830,725 B2 | 9/2014 | Bethune et al. | |
| 2008/0121862 A1* | 5/2008 | Liu | G11C 13/0004 257/4 |
| 2013/0044532 A1* | 2/2013 | Bethune | G11C 13/003 365/148 |
| 2013/0087856 A1 | 4/2013 | Ortolland et al. | |

OTHER PUBLICATIONS

Kuo et al., "Interface stoichiometry dependence of the Schottky barrier height of CoGa and GaAs", Journal of Vacuum Science & Technology B 10, 1923 (1992); doi: 10.1116/1.586159, pp. 1922-1927, Copyright 1992 American Vacuum Society.
Shenoy et al., "MIEC (mixed-ionic-electronic-conduction)-based access devices for non-volatile crossbar memory arrays", Semicond. Sci. Technol. 29 (2014) 104005 (11pp), IOP Publishing, Semiconductor Science and Technology, © 2014 IOP Publishing Ltd, pp. 1-11, doi.org/10.1088/0268-1242/29/10/104005.

* cited by examiner

*Primary Examiner* — Mamadou Diallo
(74) *Attorney, Agent, or Firm* — Isaac J. Gooshaw (57) ABSTRACT

A device that includes a semiconductor device and a contact electrode with a first side that is opposite a second side. The first side abuts the semiconductor device. The contact electrode has a stoichiometry that varies from the first side to the second side. The stoichiometry of the first side inhibits the diffusion of metal from the semiconductor device into the first contact electrode.

20 Claims, 8 Drawing Sheets

SEMICONDUCTOR DEVICE WITH A STOICHIOMETRIC GRADIENT

BACKGROUND OF THE INVENTION

The present invention relates generally to the field of semiconductor devices, and more particularly to formation of electrical contacts for semiconductor devices.

Copper has a tendency to diffuse into adjacent material layers, such as the insulating layers that copper interconnects are formed in. Thus, diffusion barriers are used to prevent the diffusion of copper. Typical diffusion barrier materials are metals or metal nitrides, as examples. Because these materials have a higher resistance than copper, the diffusion barriers are typically made very thin to avoid excessively increasing the resistance of conductive features. However, such thin diffusion barriers have a tendency to form weak spots and holes, which can permit copper to diffuse into adjacent material layers.

One possible consequence of diffusion of metal from one layer of semiconductor material to another, in a semiconductor device, is the alteration of the effective work function of one or both layers. Most semiconductor materials have a carefully selected and controlled elemental composition and stoichiometry. If either the elemental composition or stoichiometry of such semiconductor materials are altered, then the semiconductor device may not function as intended, if at all. As such, the use of diffusion barriers is prevalent in the fabrication of many semiconductor devices. However, diffusion barriers occupy space between adjacent layers of semiconductor material, which increases the size of semiconductor devices. Their formation requires additional fabrication steps. In addition, inclusion of diffusion barriers often alters the effective work function of semiconductor devices. For at least that reason, diffusion barriers are typically made as thin as possible.

SUMMARY

According to one embodiment of the present disclosure, a method of forming a contact electrode is disclosed. The method includes forming a semiconductor device; and forming a first contact electrode with a first side that is opposite a second side. The first side abuts the semiconductor device. The first contact electrode has a stoichiometry that varies from the first side to the second side. The stoichiometry of the first side inhibits the diffusion of metal from the semiconductor device into the first contact electrode.

According to one embodiment of the present disclosure, a device is provided. The device including a first material layer with a composition of one of: $M_aX_bY_2$ or $M_8XY_6$; and a first contact electrode with a first side that is opposite a second side. The first side abuts the first material layer. The first contact electrode has a stoichiometry that varies from the first side to the second side. The stoichiometry of the first side inhibits the diffusion of metal from the first material layer into the first contact electrode.

According to one embodiment of the present disclosure, a method of reading a memory element includes applying voltage to the device of claim 16, thereby changing the state of the memory element; and reading-out the state of the memory element, wherein the state that is read-out is the resistance of one of the memory elements.

BRIEF DESCRIPTION OF THE SEVERAL VIEWS OF THE DRAWINGS

The following detailed description, given by way of example and not intend to limit the disclosure solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Resistive random-access memory (RRAM or ReRAM) is a type of non-volatile random-access memory (NVM) that works by changing the resistance across a dielectric solid-state material often referred to as a memristor. This technology bears some similarities to conductive-bridging RAM (CBRAM, also called programmable metallization cell (PMC)) and phase-change memory (PCM).

Phase-change memory (also known as PCM, PCME, PRAM, PCRAM, Ovonic Unified Memory, and Chalcogenide RAM (C-RAM)) is a type of non-volatile random-access memory. PCMs exploit the unique behavior of chalcogenide glass. One known phase change material, used in PCM fabrication, is a germanium-antimony-tellurium alloy $Ge_2Sb_2Te_5$ (GST). GST is a phase change material from the group of chalcogenide glasses used in rewritable optical discs and phase-change memory applications.

In some PCMs, heat produced by the passage of an electric current through a heating element, generally made of Titanium Nitride (TiN), is used to either quickly heat and quench the glass, making it amorphous, or to hold it in its crystallization temperature range for some time, thereby switching it to a crystalline state. PCM also has the ability to achieve a number of distinct intermediary states, thereby having the ability to hold multiple bits in a single cell, but the difficulties in programming cells in this way has prevented these capabilities from being implemented in other technologies (most notably flash memory) with the same capability. In contrast to PCMs, CBRAM involves one electrode providing ions which dissolve readily in an electrolyte material, while PCM involves generating sufficient Joule heating to effect amorphous-to-crystalline or crystalline-to-amorphous phase changes.

CBRAM is based on the physical re-location of ions within a solid electrolyte. A CBRAM memory cell is made of two solid metal electrodes, one relatively inert (e.g., tungsten) the other electrochemically active (e.g., silver or copper), with a thin film of the electrolyte between them. A control transistor is often included in each cell. When a negative bias is applied to the inert electrode, metal ions in the electrolyte, as well as some originating from the now-positive active electrode, flow in the electrolyte and are reduced (converted to atoms) by electrons from the inert electrode. After a short period of time the ions flowing into the filament form a small metallic "nanowire" between the two electrodes. The "nanowire" dramatically reduces the resistance along that path, which can be measured to indicate that the "writing" process is complete. At low programming currents (e.g., less than 1 microampere), the nanowire may not be continuous but a chain of electrodeposited islands or nano-crystals, whereas at higher programming currents a mostly metallic conductor prevails.

In contrast to CBRAMs, RRAM involves generating defects in a thin oxide layer, known as oxygen vacancies (oxide bond locations where the oxygen has been removed), which can subsequently charge and drift under an electric field. The motion of oxygen ions and vacancies in the oxide would be analogous to the motion of electrons and holes in a semiconductor. CBRAM differs from RRAM in that for CBRAM metal ions dissolve readily in the material between the two electrodes, while for RRAM, the material between the electrodes requires a high electric field causing local damage akin to dielectric breakdown, producing a trail of conducting defects (sometimes called a "filament"). Hence for CBRAM, one electrode must provide the dissolving ions, while for RRAM, a one-time "forming" step is required to generate the local damage.

RRAM is based on resistive switching between a high resistance state (HRS) and a low resistance state (LRS) by the application of an appropriate voltage. Depending on the bias polarity of its program and erase operations, RRAM device is categorized as bipolar-type and unipolar-type. In the case of a bipolar-type RRAM device, the polarity between switching from the HRS to the LRS (Set process) is reversed compared to the switching from the LRS to the HRS (Reset process). On the contrary, the same polarity is used for the Set and Reset operations in a unipolar-type RRAM device.

Because of its simple capacitor-like structure composed of an insulating or resistive material sandwiched between two electron-conductive electrodes, resistive random access memory (RRAM) has been seen as highly promising for use in crossbar array with the smallest cell size of 4 $F^2$ (F is the minimum feature size) for high density nonvolatile memory applications. However, a crossbar array consisting of only RRAM cell typically suffers unavoidable cross-talk interference due to leakage current paths through neighboring unselected cells with low resistances, which leads to a misreading problem, a fatal hindrance in practical memory applications.

The integration of a selecting diode to each RRAM cell is one of the most familiar solutions to diminish the sneak current in crossbar array, because the one diode-one resistor structure is not only compatible with 4 $F^2$ density, but also has high potential for three-dimensional (3D) stackable integration to further increase density to 4 $F^2/n$. In some solutions, different types of diodes for unipolar-type RRAM crossbar array have been integrated with a FET to reduce sneak current. However, the small separation at the same polarity for the unipolar resistive switching decreases the reliability of programming. In contrast, bipolar resistive switching with wide separation of Set and Reset voltages, at opposite polarities, increases the reliability of programming.

One embodiment of the present invention provides an access device integrated with a non-volatile crossbar resistive memory (NVM). One embodiment of the present invention provides a diode as an access device for an NVM crossbar array. Embodiments of the present invention provide a contact electrode, connected to the access device, that has a nitrogen gradient such that there is a higher concentration of nitrogen at the interface of the access device and the contact electrode. One embodiment of the present invention provides a contact electrode with a nitrogen gradient that is greater than fifty percent nitrogen (approximately fifty-five percent) for at least one nanometer from the interface of the access device and the contact electrode. One embodiment of the present invention provides a contact electrode with a nitrogen content that returns to stoichiometric levels after passing one nanometer from the interface of the access device and the contact electrode.

One embodiment of the present invention provides a contact electrode with a nitrogen gradient that is tuned to reduce metal diffusion from the access device into the contact electrode. One embodiment of the present invention provides a contact electrode with a nitrogen gradient that has a Schottky-barrier height that is substantially similar to a Schottky-barrier height of a contact electrode that does not have the nitrogen gradient (both contact electrodes have a substantially similar overall stoichiometry). One embodiment of the present invention provides a contact electrode with stoichiometric variation at and near the interface between the access device and the contact electrode, and not the entirety of the contact material that comprises the contact electrode. One embodiment of the present invention provides a contact electrode with internal stoichiometric variation that is tuned to reduce metal diffusion between the access device and the contact electrode, while substantially maintaining an effective work function that is substantially similar to an effective work function of a contact electrode that does not have the internal stoichiometric variation (both contact electrodes have a substantially similar overall stoichiometry).

Dynamic random-access memory (DRAM) is a type of random-access memory that stores each bit of data in a separate capacitor within an integrated circuit. The capacitor can be either charged or discharged; these two states are taken to represent the two values of a bit, conventionally called 0 and 1. Since even "non-conducting" transistors typically leak a small amount, the capacitors will slowly discharge, and the information eventually fades unless the capacitor charge is refreshed periodically. Because of this refresh requirement, it is a dynamic memory as opposed to SRAM and other static memory.

Static random-access memory (SRAM or static RAM) is a type of semiconductor memory that uses bistable latching circuitry to store each bit. The term static differentiates it from DRAM, which must be periodically refreshed. SRAM exhibits data remanence (the residual representation of digital data that remains even after attempts have been made to remove or erase the data), but it is still volatile in the conventional sense that data is eventually lost when the memory is not powered.

One advantage of DRAM is its structural simplicity; that is, only one transistor and a capacitor are required per bit, compared to four or six transistors in SRAM. This allows DRAM to reach very high densities. Unlike flash memory (non-volatile computer storage medium that can be electrically erased and reprogrammed), DRAM is volatile memory, since it loses its data quickly when power is removed. The transistors and capacitors used for DRAM are often extremely small. For example, billions of such transistors and capacitors can fit on a single memory chip.

Exemplary embodiments now will be described more fully herein with reference to the accompanying drawings, in which exemplary embodiments are shown. In the following detailed description, numerous specific details are set forth in order to provide a thorough understanding of various embodiments of the invention. However, it is to be understood that embodiments of the invention may be practiced without these specific details. As such, this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

As described below in conjunction with FIG. 1, embodiments may include methods of forming a semiconductor device with a contact electrode that has a stoichiometric gradient. The method described below in conjunction with FIG. 1 may be incorporated into typical semiconductor fabrication processes, such as non-volatile memory fabrication processes described below in conjunction with FIG. 1.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

As used herein, semiconductor structures refer to one or more physical structures that comprise semiconductor devices.

The present invention will now be described in detail with reference to the Figures.

Figure 1A:
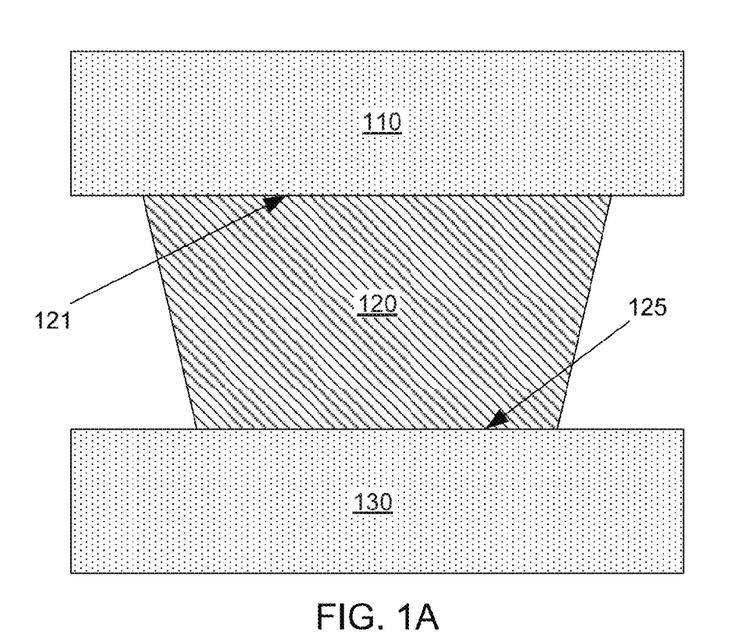
FIG. 1A illustrates a cross-sectional view depicting a pair of contact electrodes attached to an access device, in accordance with an exemplary embodiment of the present invention.

Referring now to FIG. 1A, FIG. 1A illustrates a cross-sectional view depicting a pair of contact electrodes (110 and 130), which are conductive regions, that are attached to access device 120, in accordance with an exemplary embodiment of the present invention. As shown in FIG. 1A, contact electrode 110 and 130 interface, i.e., are connected to, access device 120 at top surface 121 and bottom surface 125 of access device 120. Note that both contact electrode 110 and 130 are composed of an electrode material with a stoichiometry that varies from a top surface to a bottom surface of contact electrode 110 and 130. For ease of understanding, as used herein, the bottom surface of an electrode is the surface that is in contact with access device 120. In one embodiment, access device is composed of a mixed ionic electronic conduction (MIEC) material. In general, access device 120 is composed of a material that includes metal(s) that have the potential to migrate into other materials that are in contact with access device 120, unless those other materials are protected from such migration. For example, access device contains copper and contact electrode 110 and 130 are not protected from the migration of copper. Therefore, the copper in access device 120 migrates into contact electrode 110 and 130. In the embodiments described herein contact electrode 110 and 130 include a stoichiometric gradient that inhibits migration of metal(s) from access device 120 into contact electrode 110 and 130. In some embodiments, access device 120 is composed of a material or combination of materials that have the characteristics of an access diode with a bipolar response. In some embodiments, access device 120 is composed of one or more crystalline materials that provide a) a high on/off ratio (e.g., $1:10^7$) and b) a high current density (e.g., 50 MA/cm$^2$). For further description regarding the composition of access device 120 see the description of FIG. 3.

Figure 1B:
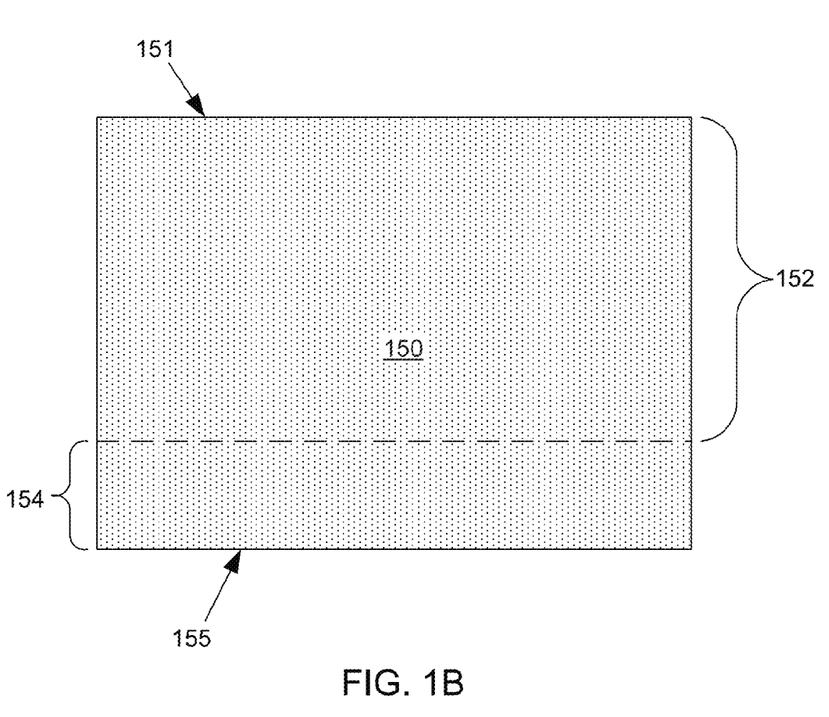
FIG. 1B illustrates a cross-sectional view depicting a contact electrode with a stoichiometry that varies from a top surface compared to a bottom surface that is in contact with a semiconductor device, in accordance with an exemplary embodiment of the present invention.

Referring now to FIG. 1B, FIG. 1B illustrates a cross-sectional view depicting contact electrode 150 with a stoichiometry that varies from top surface 151 compared to bottom surface 155 that is in contact with access device 120, in accordance with an exemplary embodiment of the present invention. Contact electrode 150 illustrates the stoichiometry that varies in both contact electrodes 110 and 130. Note that contact electrode 150 is composed of Titanium Nitride (TiN). In FIG. 1, each bottom surface 155 of contact electrode 110 and 130 is to be understood as being in contact with access device 120. In other words, bottom surface 155 of contact electrode 110 is in contact with at top surface 121 of access device 120. However, bottom surface 155 of contact electrode 130 is in contact with at bottom surface 125 of access device 120.

Contact electrode 150 is formed such that variation of either one or both of Titanium and Nitrogen during deposition of the TiN layer, which comprises contact electrode 150, yields an internal stoichiometric gradient. In other words, as TiN deposition begins, the ratio of Titanium to Nitrogen is shifted in favor of Nitrogen, i.e., there is more Nitrogen being deposited than Titanium. This yields a first portion 154 of contact electrode 150 that is nitrogen rich, as shown in FIG. 1B. Note that the area containing first portion 154 is denoted using both a dashed line running across contact electrode 150 as well as by a numbered bracket. As such, in FIG. 1A, an outside surface of first portion 154 (not shown), corresponding to contact electrode 110 and 130, is in contact with top surface 121 and bottom surface 125 of access device 120. In this embodiment, first portion 154 has a Nitrogen content of fifty-five percent. As such, with reference to FIGS. 1A and 1B, first portion 154 is in contact with access device 120.

In this embodiment, first portion 154 is one nano-meter thick, i.e., composes the first nano-meter of material of contact electrode 150. The high Nitrogen content of first portion 154 reduces diffusion of metal between contact electrode 150 and access device 120. In this case, the reduction of metal diffusion is unidirectional, since first portion 154 reduces diffusion of metal from access device 120 into contact electrode 150. In the present embodiment, first portion 154 of contact electrode 110 is in contact with at top surface 121 of access device 120 and first portion 154 of contact electrode 130 is in contact with at bottom surface 125 of access device 120. Thus, in reference to FIGS. 1A and 1B, the orientation of first portion 154 and second portion 152 of contact electrode 110 is essentially the same as that shown in FIG. 1B. Note that the area of contact electrode 150 that includes second portion 152 is indicated using a numbered bracket and the dashed line. However, in contrast, with reference to FIGS. 1A and 1B, the orientation of first portion 154 and second portion 152, of contact electrode 130, is essentially inverted with respect to the orientation shown in FIG. 1B. In other words, if contact electrode 150, as shown in FIG. 1B, were rotated one hundred and eighty degrees, then the orientation of first portion 154 and second portion 152 of contact electrode 150 would reflect the orientation of first portion 154 and second portion 152 of contact electrode 130 in FIG. 1A.

In one embodiment, as deposition of the TiN layer continues, the ratio of Titanium to Nitrogen is shifted mid-deposition such that second portion 152 of contact electrode 150 has a one to one ratio of Titanium to Nitrogen. As shown in FIG. 1, second portion 152 of contact electrode 150 is formed on top of first portion 154. In this embodiment, second portion 152 is five nano-meters thick, i.e., it comprises the top-most five nano-meters of material of contact electrode 150.

Note that, in some embodiments, the overall stoichiometry for the contact material (e.g., metal nitride alloy) that comprises contact electrode 150 closely matches a predetermined overall stoichiometry, in this case TiN. For example, in FIG. 1B, the contact electrode has an overall stoichiometry that is close to one Titanium atom to one Nitrogen atom. In this embodiment, the internal variation in stoichiometry does not substantially change the effective work function of either the contact electrode or any semiconductor device that is connected to that contact electrode. If any change in work function does result, then that change is relatively small (i.e., below a threshold). For example, Nitrogen rich first portion 154 has a valence band offset that is very similar to the valence band offset of the second portion 152. As such, the difference between effective work functions of Nitrogen rich TiN and stoichiometric TiN (1:1 ratio of Titanium and Nitrogen) is only 35 meV. This is in contrast to a TiN material that is Titanium rich, which has an effective work function approximately 0.37 eV lower than stoichiometric TiN. As such, use of Nitrogen rich TiN is seen to have a minimal impact on device characteristics, while use of Titanium rich TiN is seen to have a comparatively large impact on device characteristics.

Following are four examples of the methods and/or techniques used to create the desired stoichiometry of contact electrode 150:

First, physical Vapor Deposition (PVD): using PVD, TiN is deposited by sputtering Ti from a target in the presence of Ni ambient. The flow rate of nitrogen is used to control the stoichiometry of the resultant TiN film. Abundant supply of Nitrogen leads to nitrogen rich TiN and a scarce supply results in nitrogen deficient TiN films. The film composition can be determined using RBS and XPS analysis.

Second, chemical Vapor Deposition (CVD): using CVD, TiN can also be deposited by thermal decomposition of a precursor such as tetrakis-dimethyl-amino-titanium in a nitrogen ambient. Partial pressures of the two reactants is controlled to obtain the desired stoichiometry.

Third, gas nitriding of the Ti surface: In gas nitriding of the titanium surface, after deposition of a Titanium film, it is heated to high temperatures (>700° C.) in the presence of ammonia ambient resulting in formation of TiN on the surface. The composition and the depth of nitrogen incorporation in the film, in this case is a function of both temperature and ammonia flow rate.

Fourth, pulse plasma nitriding of Ti surface: using pulse plasma nitriding of Ti surface, TiN is formed using pulse plasma nitriding of Ti film. In this case, instead of utilizing a high temperature (such as used in gas nitriding of the Ti surface), a plasma is created above the film using gas such as mixture of Argon and $N_2$. The pulse (few microseconds width) is kept on for 10% to 50% of the cycle. The process can be performed at temperatures ranging from 275° C. to 700° C.

In general, methods and/or techniques used to create the desired stoichiometry of contact electrode 150 are determined based on the component(s) to which contact electrode 150 is attached. In some embodiments, contact electrode 150 has two first portion 154 with a single second portion 152 in between. An example of such an embodiment is shown in FIG. 2A.

Figure 2A:
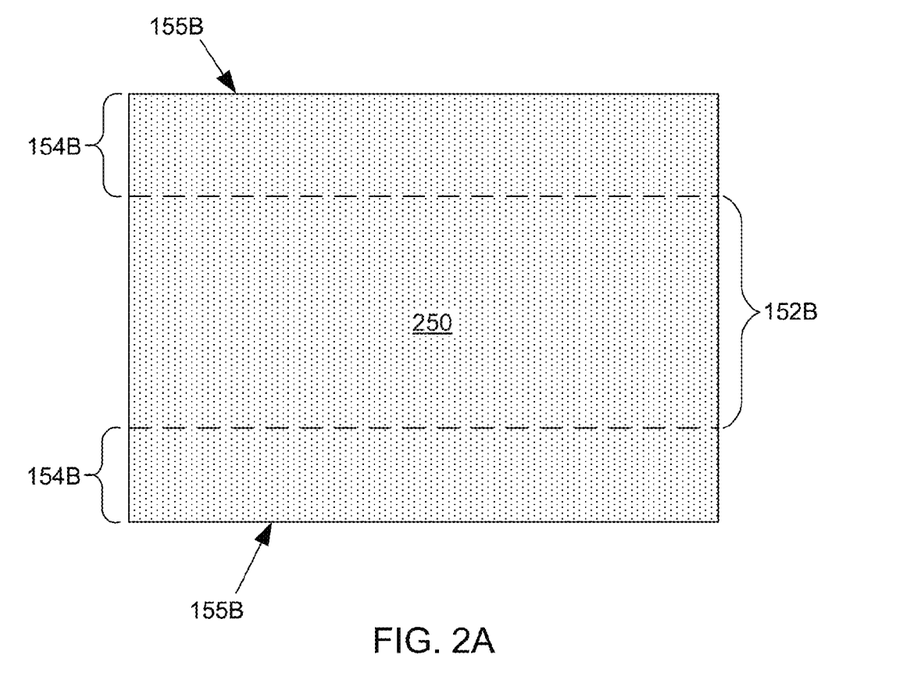
FIG. 2A illustrates a cross-sectional view depicting a variation in stoichiometry in a contact electrode, in accordance with an exemplary embodiment of the present invention.

Referring now to FIG. 2A, FIG. 2A illustrates a cross-sectional view depicting contact electrode 250 with a stoichiometry that varies between bottom surfaces 155B that are in contact with components (not shown, e.g., two access device 120), in accordance with an exemplary embodiment of the present invention. In FIG. 2A, first portions 154B are shown with a single second portion 152B between. The areas containing first portions 154B are denoted using both dashed lines running across contact electrode 250 as well as by numbered brackets. As shown in FIG. 2A, each of first portions 154B has a corresponding bottom surface 155B. In general, the descriptions of the stoichiometry and compositions of first portions 154B and second portion 152B correspond to the descriptions of first portion 154 of FIG. 1B and the descriptions of second portion 152 of FIG. 1B. In other words, first portion 154B of contact electrode 250 is nitrogen rich when compared with second portion 152B.

Figure 2B:
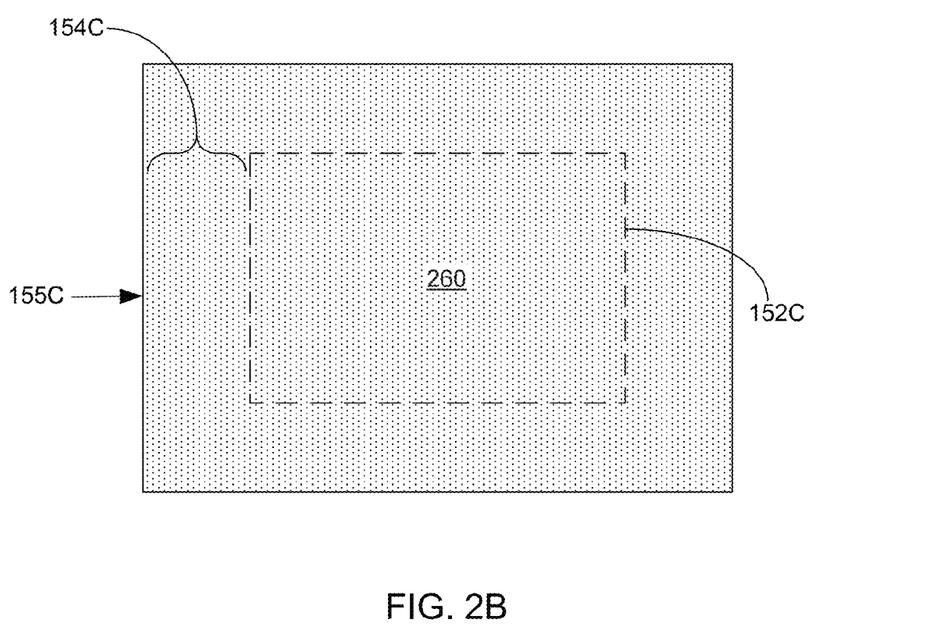
FIG. 2B illustrates a cross-sectional view depicting a variation in stoichiometry in a contact electrode, in accordance with an exemplary embodiment of the present invention.

Referring now to FIG. 2B, FIG. 2B illustrates a cross-sectional view depicting contact electrode 260 with a stoichiometry that varies between opposite sides of bottom surface 155C that are in contact with components (not shown, e.g., two or more access device 120), in accordance with an exemplary embodiment of the present invention. In FIG. 2B, first portion 154C wraps around the outside of second portion 152C, in accordance with an exemplary embodiment of the present invention. The area containing second portion 152C is denoted using both a dashed line box within contact electrode 260. The area of contact electrode 260 that contains first portion 154C is denoted using a numbered bracket. Therefore, bottom surface 155C is seen as surrounding second portion 152C and as comprising the outside surface of contact electrode 260. In general, the descriptions of the stoichiometry and compositions of first portions 154C and second portion 152C correspond to the descriptions of first portion 154 of FIG. 1B and the descriptions of second portion 152 of FIG. 1B. In other words, first portion 154C of contact electrode 260 is nitrogen rich when compared with second portion 152C.

Figure 3:
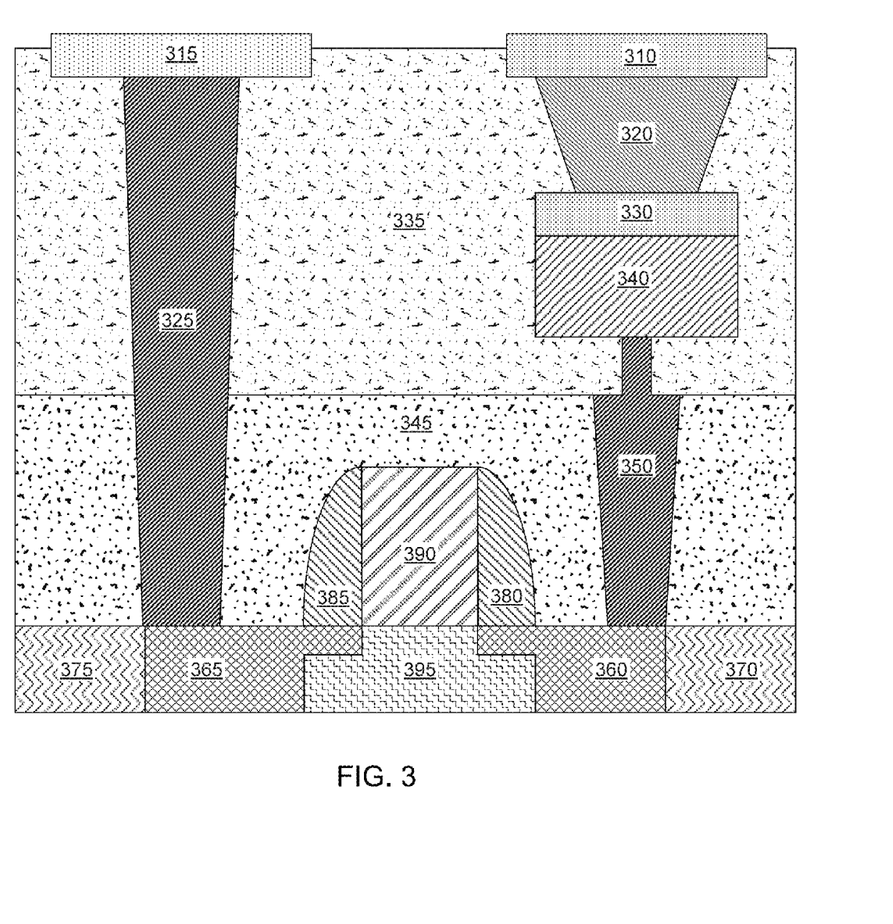
FIG. 3 illustrates a cross-sectional view depicting an example of a semiconductor structure that includes contact electrodes (with stoichiometry that varies) connected to an access device, according to one embodiment of the present invention.

Referring now to FIG. 3, FIG. 3 illustrates a cross-sectional view depicting an example of a semiconductor structure that includes contact electrodes (310 and 330) connected to access device (320), according to one embodiment of the present invention. FIG. 3 illustrates a field effect transistor device that is included as part of a resistive non-volatile memory. For example, such as those found in non-volatile three dimensional cross-bar architecture for resistive non-volatile memory. In FIG. 3, access device 320 is an access diode that is connected to contact electrodes 310 and 330. In this embodiment, access device 320 is composed of a mixed ionic electronic conduction (MIEC) material. In this embodiment, contact electrode 310 follows the composition, stoichiometry, and configuration of contact electrode 150 of FIG. 1B. In contrast, contact electrode 330 follows the composition, stoichiometry, and configuration of contact electrode 250 of FIG. 2A. Also connected to contact electrode 330 is semiconductor structure 340, which is composed of a phase change/memory material, e.g., germanium-antimony-tellurium ($Ge_2Sb_2Te_5$) (also called GST). FIG. 3 also illustrates two dielectric layers (335 and 345). In this embodiment, dielectric layers 335 and 345 are composed of deposited dielectric materials such as, for example, silicon nitride, silicon oxide, SiBCN, and SiOCN.

A number of openings were etched through portions of one or both of dielectric layers 335 and 345. These openings were then filled with a contact material (such as tungsten, titanium, titanium nitride, copper, or any suitable combination of those materials), thereby forming vertical interconnect 325 and 350 that form electrical connections with source/drain structure 365 and source/drain structure 360.

FIG. 3 illustrates metal contact 315 connected to vertical interconnect 325. Vertical interconnect 325 is connected to source/drain structure 365. FIG. 3 also shows gate spacers 380 and 385 abutting gate 390. Below gate 390 is channel region 395. FIG. 3 also illustrates isolation trenches 370 and 375. Note that vertical interconnect 350 is connected to source/drain structure 360. As such, the field effect transistor device of FIG. 3 includes at least source/drain structure 365, source/drain structure 360, gate 390, channel region 395, and gate spacers 380 and 385. Therefore, the activation/deactivation of the field effect transistor device is controlled by a semiconductor control structure that includes contact electrodes 310 and 330, access device 320, and semiconductor structure 340. This semiconductor control structure is, in this embodiment, a type of access diode, such as those found in certain types of resistive non-volatile memory. For example, in some embodiments, such an access device represents access device 120.

With reference to possible compositions of access device 120 of FIG. 1, one embodiment of the present invention provides for a family of crystalline materials that is used as high-current density "access devices" in electronic applications involving dense arrays of components such as memories and displays, wherein the crystalline materials have at least one of the following chemical formulas:

$M_aX_bY_2$,  (composition 1)

where i) a=0.4 to 1.2, b=0.8 to 1.2, ii) M is selected from the group consisting of Cu, Ag, Li and Zn, iii) X is selected from the group consisting of Cr, Mo and W, and iv) Y is selected from the group consisting of Se, S, O and Te;

or $M_8XY_6$,  (composition 2)

where M includes at least one element selected from the group consisting of Cu, Ag, Li, and Zn; X includes at least one Group XIV element; and Y includes at least one Group XVI element. In some embodiments, X includes at least one element selected from the group consisting of Ge, Si, Sn, and C. In some embodiments, Y includes at least one element selected from the group consisting of Se, S, 0, and Te. In some embodiments, M comprises either one or a plurality of elements ($M_{a1} \ldots M_{an}$), such that $a_1 + \ldots + a_n = 8$. For example, $M_8XY_6$ is any of the following: $Cu_8GeS_6$, $Cu_8GeSe_6$ or $Ag_{4.7}Cu_{3.3}GeS_6$. In one example, two conductive layers (denoted first and second) sandwich the layer of $M_8XY_6$. In this example, the first conductive layer is any of the following: a Cu-containing layer or a $Cu_3Ge$ layer and the second conducting layer conductive layer includes tungsten (e.g., a TiN layer with a stoichiometric gradient).

Figures 4A, 4B:
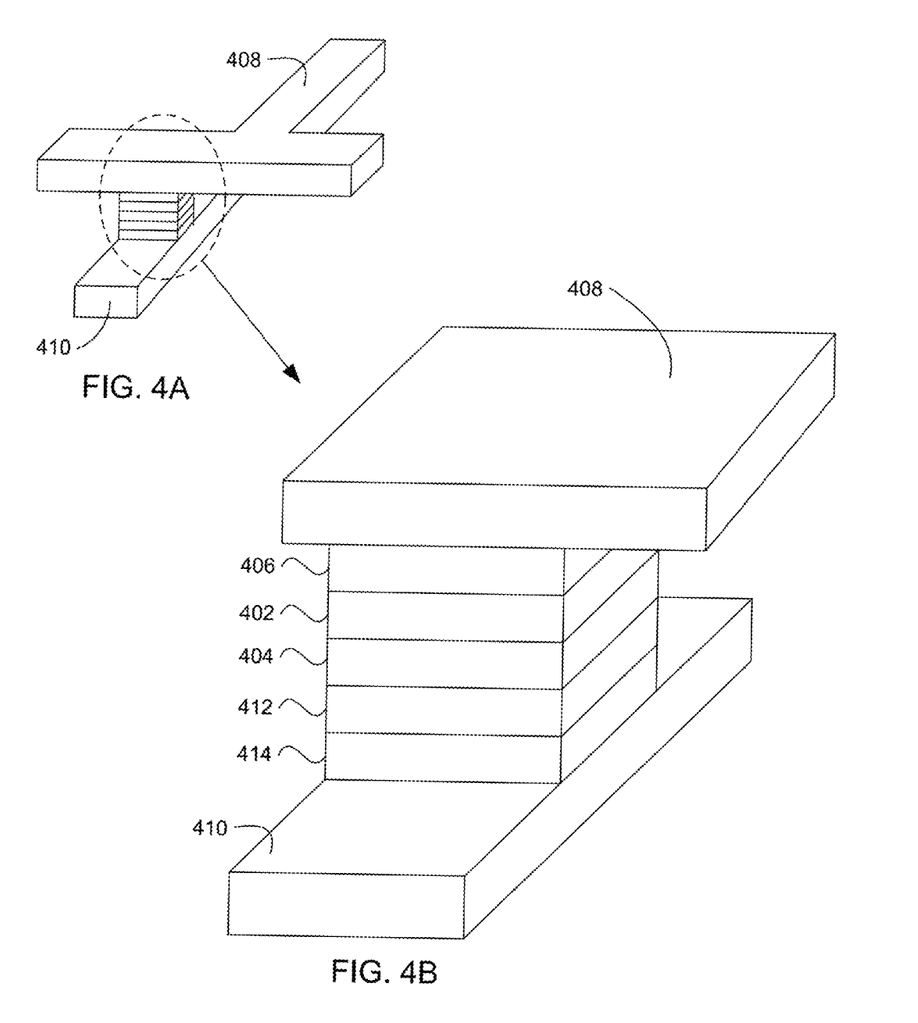
FIGS. 4A and 4B illustrate a thin-film comprising a $Cu_{0.24}Cr_{0.26}S_{0.5}$ layer that is sandwiched between electrodes, in accordance with an exemplary embodiment of the present invention.

For simplicity, the following examples and embodiments will reference $M_aX_bY_2$ (composition 1). However, $M_8XY_6$, (composition 2) can be substituted in most cases without deviation from the scope of this disclosure. The exception being cases where reference to specific compositions (element type and quantity) are provided that do not match $M_8XY_6$. With reference to FIGS. 1, 4A and 4B, one embodiment of the present invention includes a device structure for use as an access structure, where a thin film of the above-mentioned $M_aX_bY_2$ material (e.g., access device 120) is sandwiched between two conductive regions, e.g., contact electrodes 110 and 130. It should be noted that although the specification discusses, in various examples, a single layer of $M_aX_bY_2$ material, one of ordinary skill in the art will recognize that multiple layers of $M_aX_bY_2$ films with different compositions may be also be used instead of such a single layer.

In one embodiment, a thin-film (typically 20-100 nm) of the above-mentioned $M_aX_bY_2$ material is sandwiched between two conductive regions, wherein the conductive regions include a layer of Titanium Nitride (TiN) and could also include other layers of metals or different semiconductors. In one non-limiting example of this embodiment, a 40 nm film that has a composition of $Cu_{0.24}Cr_{0.26}S_{0.5}$, which is sandwiched between a W containing electrode and a Pt containing electrode, whereby this setup exhibited Schottky diode-like characteristics with the Pt containing electrode when the W containing electrode is swept negative with respect to the Pt containing electrode. In the above example, the W containing electrode and P containing electrode both include a layer of Titanium Nitride (TiN) that includes an internal stoichiometric gradient and the layer of TiN is in contact with the film $CU_{0.24}Cr_{0.26}S_{0.5}$.

FIGS. 4A and 4B depict an embodiment, where a thin-film comprising a $Cu_{0.24}Cr_{0.26}S_{0.5}$ layer 402 is sandwiched between conducting regions 404 and 406. This combination of elements is also illustrated in FIG. 1 as access device 120 being sandwiched between contact electrodes 110 and 130. The conducting regions (404 and 406), the $Cu_{0.24}Cr_{0.26}S_{0.5}$ layer 402, the phase change/memory material 412, and conductive region 414 are in series electrical connection with a word line 408 and a bit line 410. It should be noted that although FIGS. 4A and 4B depict a single $Cu_{0.24}Cr_{0.26}S_{0.5}$ layer, one of ordinary skill in the art will recognize that the $Cu_{0.24}Cr_{0.26}S_{0.5}$ layer may be present with one or more interfacial layers. In a non-limiting example, each of the conducting regions 404 and 406 are formed such that they include at least one layer of Titanium Nitride (TiN) that has an internal stoichiometric gradient.

It should be noted that in the above-described example, although a specific example of $Cu_{0.24}Cr_{0.26}S_{0.5}$ layer 402 is used, it should be noted that slight variances are within the scope of this embodiment. For example, layer 402 could be of the following makeup: $Cu_{0.24\pm0.005}Cr_{0.26\pm0.005}S_{0.5\pm0.01}$. Furthermore, other trace impurities could also be present as part of layer 402.

Voltage margin is defined as the range of voltage across the access device for which the current through it is always below 10 nA. For instance, if the current increases above 10 nA at −|Vb| volts on the negative side and at +|Va| volts on the positive side of a curve that plots access device current versus voltage applied to the top electrode (with the bottom electrode grounded), then the voltage margin would be equal to |Va|+|Vb|.

Although a few non-limiting examples of possible device structures are shown and discussed below, it should be noted that there are many possible device structures that could be fabricated using semiconductor fabrication tools/processes that could be made to exhibit the above device characteristics.

Figure 5:
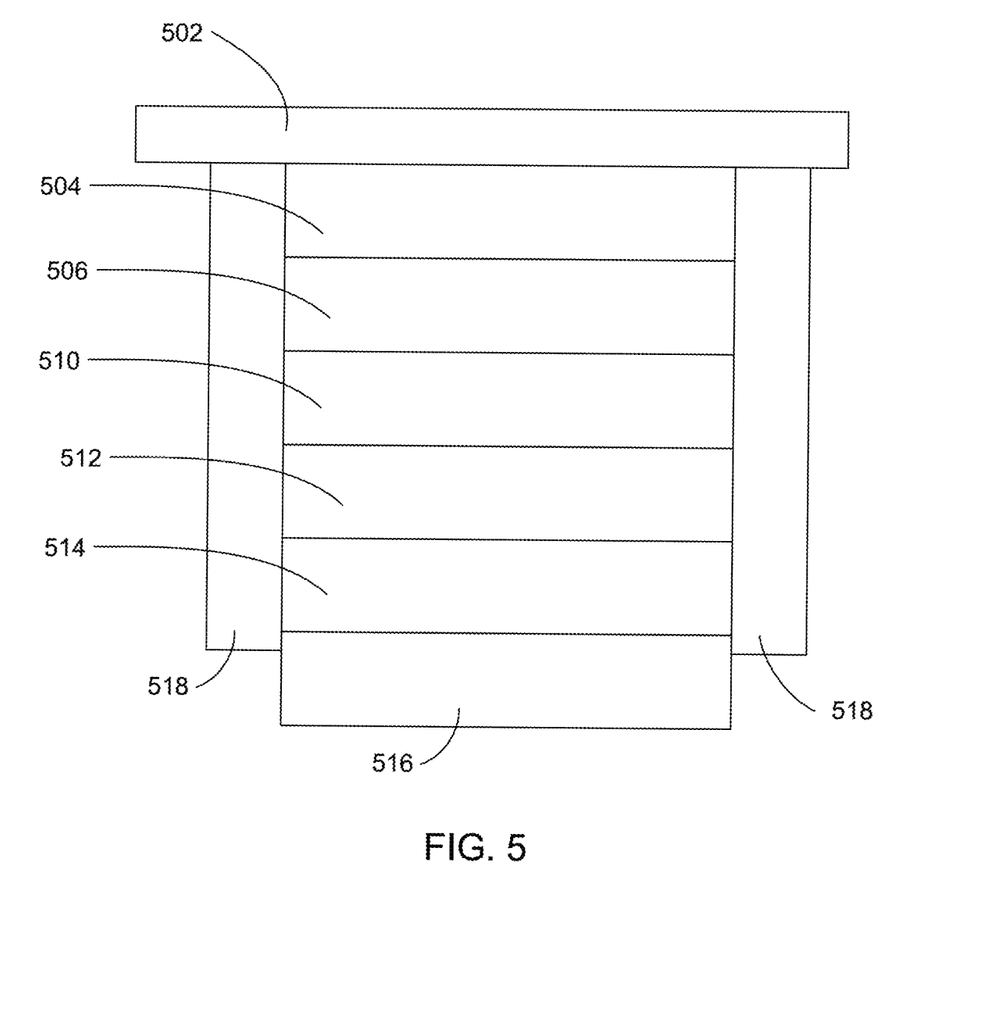
FIG. 5 depicts an example of a device stack structure wherein a $M_aX_bY_2$ layer is sandwiched between dielectrics on its side, and electrodes/semiconductors on the top and bottom, in accordance with an exemplary embodiment of the present invention.

FIG. 5 depicts a device structure for the access-device stack, wherein a $M_aX_bY_2$ layer 506 is sandwiched between portions of dielectric 518 on its sides, and electrodes/semiconductors on the top and bottom in electrical series with word and bit lines 502 and 516. The device structure of FIG. 5 also depicts tungsten metal lines 504, 510, & 514, and phase change/memory material 512. One way of building such a structure is to fill the $M_aX_bY_2$ material into a pore or via (a vertical interconnect). The dielectrics into which a via is etched could be made of silicon oxide, silicon nitride or some other low-K dielectric.

Provided below is a non-limiting example of how the stack shown in FIG. 5 may be manufactured. Dielectric 518 is deposited using, for example, physical or chemical vapor deposition, onto a wafer that has patterned lines of bit lines 516. Lithography is then performed on dielectric 518 to open up pores using a technique such as reactive plasma etching. $M_aX_bY_2$ layer 506 may be deposited using physical vapor deposition usually at elevated temperatures. Layers 504, 506, 510, 512, 514 can be deposited using a variety of different techniques including, but not limited to, Chemical Vapor deposition (CVD), Physical Vapor deposition techniques (PVD—for example sputtering, evaporation etc.), spin-on techniques, Atomic Layer deposition techniques (ALD), etc. Also, specific features of such layers can be defined using various lithography techniques, etching, chemical mechanical polishing, liftoff, etc. For fabricating each of these structures, various possible process flows are possible.

The example depicted in FIG. 5 illustrates an embodiment where a thin film of $M_aX_bY_2$ is disposed between two electrodes and perpendicularly oriented word and bit lines. Thus, $M_aX_bY_2$ and its associated interfacial layers and electrodes connect to other elements, such as memory elements (e.g., phase change memory (PCM), resistive RAM (RRAM), magneto-resistive RAM (MRAM), etc.), resistors, LED stack or liquid crystal elements, in series.

A cross-point memory array can be formed from an array of the devices shown in FIGS. 4 and 5, wherein a voltage can be applied to the cross-point array to change the state of one of the memory elements, which can be followed by a subsequent step of reading the state of the memory elements. For example, the state that is read-out may be the resistance of the one of the memory elements.

Furthermore, as noted above, the stack structures shown in FIG. 5 is merely a representative example, as there are many other device structures possible including mushroom-shaped cells, recessed mushroom cells, ring-shaped electrode and pillar cells. For each of these structures, many different process flows (integration schemes) are possible.

Furthermore, in some cases, where a thin film of $M_aX_bY_2$ is sandwiched between two electrodes, it is advantageous to scale the area of one of the contacts relative to the other to tune the electrical properties of this stack. For example, properties such as voltage margins, peak currents and sub-threshold slopes can be tuned using area symmetries.

It should be noted that there are a plurality of ways to produce $M_aX_bY_2$, a few of which are listed hereafter.

The first technique is sputtering. The sputtering technique involves directly sputtering a thin film of $M_aX_bY_2$ using co-sputtering from one or more targets. Reactive gases (including those containing Y) may also be used during sputtering. Furthermore, it might be advantageous to deposit the $M_aX_bY_2$ at elevated temperatures (but still below 400° C.). One reason to deposit at elevated temperatures is to make the film crystalline. Furthermore, elevated temperature deposition aids in filling small pore structures and also mitigates detrimental effects of plasma on the thin film. Some sputtering examples include a) deposition from a $M_aX_bY_2$ target; b) deposition from a $M_aX_bY_2$ target in the presence of $H_2Y$; c) co-sputtering from a $M_aY$ and X targets; and d) deposition from M and X in a $H_2Y$ or other reactive ambient.

The second technique is Chemical Vapor Deposition (CVD) or Atomic Layer Deposition (ALD). The processes of CVD or ALD may be used to deposit $M_aX_bY_2$ on any desired substrate.

It should be noted that there are a number of possible structures that combine Phase Change Memory (PCM) and the present invention's $M_aX_bY_2$ layer. There are 4 PCM cell structures of interest—mushroom, recessed-mushroom, pore-cell (or memory-in-via) and ring-shaped electrode. Each structure could be fabricated using a number of different flows. Each device structure for the $M_aX_bY_2$ selection device could be combined with any of these four PCM cell structures in series with word and bit lines to yield a variety of possible structures/process-flows.

Figure 6A:
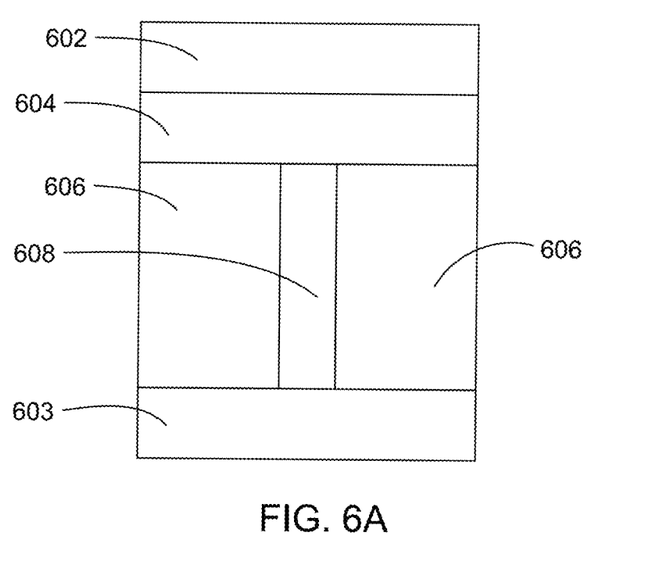
FIGS. 6A-6F illustrate non-limiting examples of various structures of interest incorporating the present invention's high-current density access device, or diode device, having a $M_aX_bY_2$ layer, in accordance with various exemplary embodiments of the present invention.
Figure 6B:
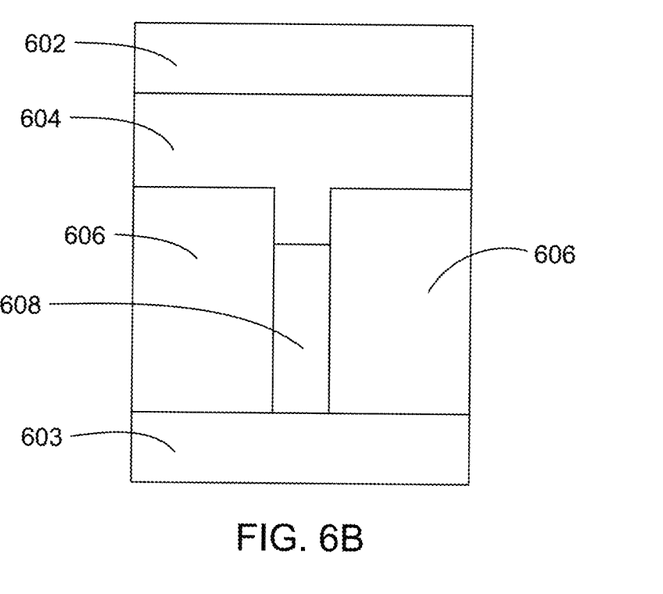
Figure 6C:
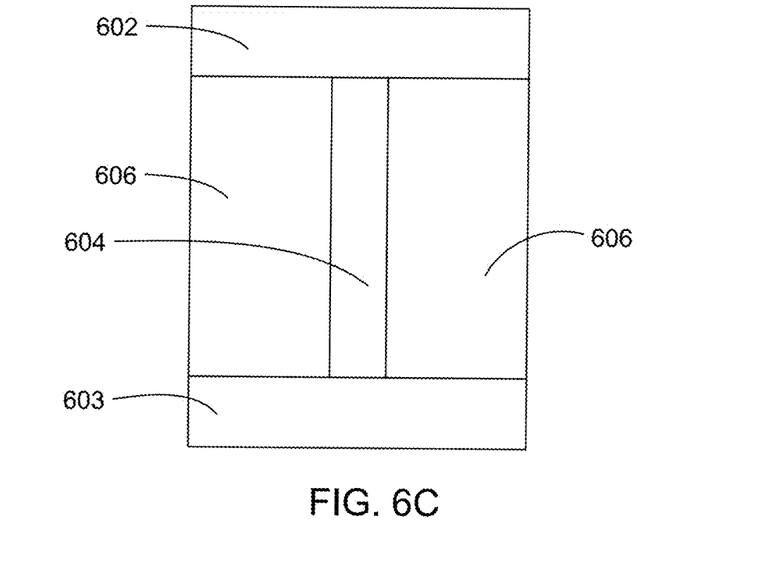
Figure 6D:
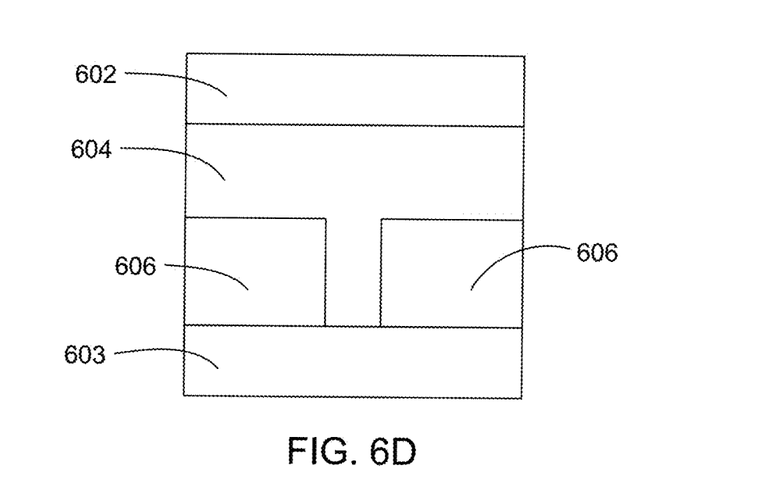
Figure 6E:
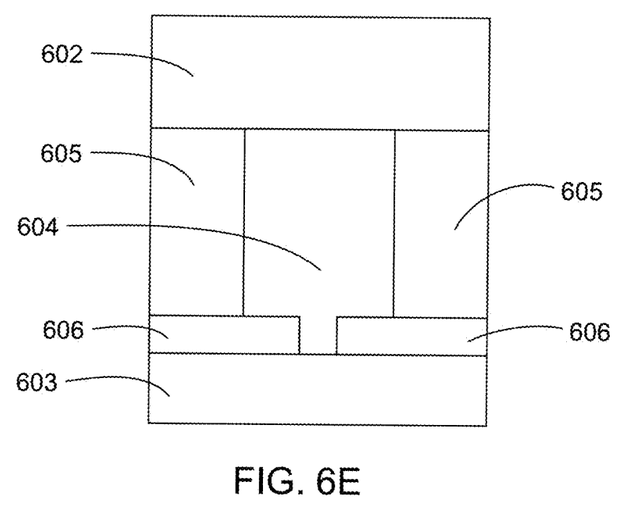
Figure 6F:
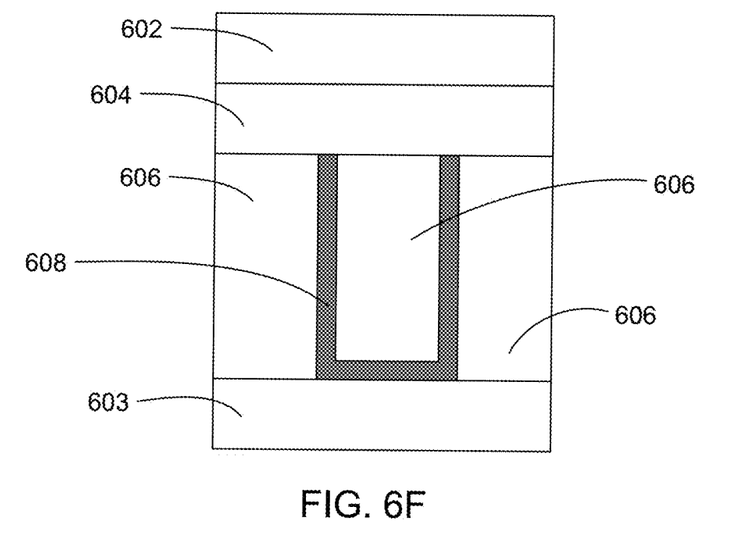

FIG. 6A illustrates a mushroom shaped structure incorporating the present invention's high-current density access device, or diode device, having a $M_aX_bY_2$ layer. FIG. 6B illustrates a recessed mushroom shaped structure incorporating the present invention's high-current density access device, or diode device, having a $M_aX_bY_2$ layer. FIG. 6C illustrates a pillar cell shaped or lithographically defined pore structure incorporating the present invention's high-current density access device, or diode device having a $M_aX_bY_2$ layer. FIG. 6D illustrates a lithographic pore structure incorporating the present invention's high-current density access device, or diode device, having a $M_aX_bY_2$ layer. FIG. 6E illustrates a sublithographic pore structure incorporating the present invention's high-current density access device, or diode device, having a $M_aX_bY_2$ layer. FIG. 6F illustrates a ring shaped structure incorporating the present invention's high-current density access device, or diode device, having a $M_aX_bY_2$ layer. In FIG. 6A through FIG. 6F, top layer 602, layer 608 (when present) and bottom layer 603 (when layer 608 is not present) are metal layers that include a layer of TiN that has an internal stoichiometric gradient (along with optional barrier, semiconductor and metal layers if necessary.) In general, these layers of TiN are in contact with layer 604. The layers of TiN inhibit the diffusion of metal from layer 604 into top layer 602 and layer 608 (when present) and bottom layer 603 (when layer 608 is not present.) Layer 604 is the present invention's high-current density access device having a $M_aX_bY_2$ layer, layer 606 is a layer formed of, for example, oxide/nitride/ dielectric/silicon or some combination of these layers, and layer 608 is a metal layer formed of, for example, TiN. Layer 605 is another layer of dielectric material and could be oxide/nitride/oxynitride, etc.

Further, for the mushroom (FIG. 6A), recessed mushroom (FIG. 6B) and the ring-shaped cell (FIG. 6F), while the bottom electrode 603 (made, for example, from TiN) is typically a small-area contact, the memory material could be a line-type or a "via-fill" type material (i.e., patterned in one dimension versus two dimensions). Similarly, for the lithographic pore embodiment shown in FIG. 6D and the sub-lithographic pore embodiment shown in FIG. 6E, two options are possible where the bottom small-area via is 2D, but the top-pore could be either line type or via-fill type. The pillar embodiment shown in FIG. 6C is confined in both directions (i.e. 2D). Optional barrier layers, adhesion layers, passivation layers and capping layers have not been shown for convenience.

It should be noted that for all of the above-mentioned structures shown in FIG. 6A through FIG. 6F, the electrodes on either side of the $M_aX_bY_2$ layer are inert (e.g., composed of TiN) or have an inert liner (e.g., composed of TiN). In either case, the TiN of the electrodes has an internal gradient wherein a portion of the electrode with a high nitrogen concentration is in contact with the $M_aX_bY_2$ layer. It should also be noted that the options illustrated in FIG. 6A through FIG. 6F may be combined together to fabricate various device structures. Each combination could be fabricated using any one out of many process flows.

Note that the methods and processes for the formation of field-effect transistor devices, isolation trenches, and dielectric layers are all well known in the art and, as such, a detailed description of their formation are excluded for the sake of brevity.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques, and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, a chemical oxide removal (COR) etching, and reactive ion etching (REI), which are all known techniques to remove select material when forming a semiconductor structure. The techniques and application of etching is well understood by those skilled in the art and, as such, a more detailed description of such processes is not presented herein.

As used herein, terms such as "depositing" and the like refer to the disposition of layers or portions of materials in the present embodiments. Such processes may not be different than in the standard practice of the art of non-volatile memory fabrication. Such practice include but are not limited to, atomic layer deposition (ALD), molecular layer deposition (MLD), chemical vapor deposition (CVD), low-pressure chemical vapor deposition (LPCVD), plasma enhanced chemical vapor deposition (PECVD), limited reaction processing CVD (LRPCVD), ultrahigh vacuum chemical vapor deposition (UHVCVD), metalorganic chemical vapor deposition (MOCVD), physical vapor deposition, sputtering, plating, evaporation, ion beam deposition, electron beam deposition, laser assisted deposition, chemical solution deposition, or any combination of those methods.

As used herein, "forming" includes processes of one or both of etching and depositing. These techniques are typically combined to create semiconductor structures of not only specific compositions but also of specific shape.

For example, the structure illustrated in FIG. 3 can be formed using a variety of methods and approaches. One example of a method to form the embodiment shown in FIG. 3 (i.e., the semiconductor control structure) is as follows (note that, for brevity, not every step in the formation process is described):

As a starting point, the field-effect transistor device previously described is formed along with vertical interconnect 350, along with dielectric layer 345. Dielectric layer 345 is formed using the deposition and etching of multiple layers of dielectric material. The removal of such material forms cavities into which other materials are deposited giving various components their shape. For example, semiconductor structure 340 is formed in a cavity by depositing TiN into an opening that was etched into a layer of dielectric material. The opening in the dielectric material extends down and through the layer of dielectric material such that when the material that comprises semiconductor structure 340 is deposited, the resulting semiconductor structure 340 is in contact with vertical interconnect 350. A similar process is followed such that contact electrode 330 is formed on top of semiconductor structure 340, access device 320 is then formed on top of contact electrode 330, and contact electrode 310 is formed on top of Access device 320. Finally, vertical interconnect 325 is formed such that it is in contact with source/drain structure 365. Note that during the formation of contact electrodes 310 and 330, one or more additional processes/techniques are employed to create the stoichiometric gradient as described above.

The methods and structures as described above are used in the fabrication of integrated circuit chips.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as, for instance, "side", "over", "perpendicular", "tilted", etc., as used herein refer to relative location and orientation of various portions of the structures with respect to one another, and are not intended to suggest that any particular absolute orientation with respect to external objects is necessary or required.

The foregoing specification also describes processing steps. While some of the steps may be in an ordered sequence, others may in different embodiments from the order that they were detailed in the foregoing specification. The ordering of steps when it occurs is explicitly expressed, for instance, by such adjectives as, "ordered", "before", "after", "following", and others with similar meaning.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art.

What is claimed is:

1. A method of forming a contact electrode, the method comprising:
   forming a semiconductor device; and
   forming a first contact electrode with a first side that is opposite a second side, wherein the first side abuts the semiconductor device, wherein the first contact electrode has a stoichiometry that varies from the first side to the second side, and wherein the stoichiometry of the first side inhibits the diffusion of metal from the semiconductor device into the first contact electrode.

2. The method of claim 1, wherein the first contact electrode has a higher concentration of non-metal elements at the first side than the second side.

3. The method of claim 1, wherein the first contact electrode has an effective work function that is substantially the same as a second contact electrode that has a consistent stoichiometry.

4. The method of claim 1, wherein variation in stoichiometry of the first contact electrode constitutes a gradient such that the ratio of two or more elements included in the first contact electrode varies from first side to second side with a first rate of change.

5. The method of claim 1, wherein the step of forming a semiconductor device further comprises:
   forming a third contact electrode with a third side that opposite a fourth side, wherein the third side is connected to the semiconductor device, wherein the third side abuts the semiconductor device, wherein the third contact electrode has a stoichiometry that varies from the third side to the fourth side, and wherein the stoichiometry of the third side inhibits the diffusion of metal from the semiconductor device into the first contact electrode.

6. The method of claim 5, wherein the third contact electrode has a higher concentration of non-metal elements at the third side than the fourth side.

7. The method of claim 5, wherein the third contact electrode has an effective work function that is substantially the same as a second contact electrode that has a consistent stoichiometry.

8. The method of claim 5, wherein variation in stoichiometry of the third contact electrode constitutes a gradient such that the ratio of two or more elements included in the third contact electrode varies from third side to the fourth side with a second rate of change.

9. The method of claim 1, wherein the first contact electrode is composed of at least titanium and nitrogen with a stoichiometry that varies from the first side to the second side such that the first side has a higher concentration of nitrogen than the second side.

10. The method of claim 1, the method further comprising:
    forming a semiconductor memory device that includes the first contact electrode, the semiconductor memory device comprising:
    a) a bit line;
    b) a $M_a X_b Y_2$ layer, wherein
       a=0.4 to 1.2, b=0.8 to 1.2,
       M is selected from the group consisting of Cu, Ag, Li and Zn,
       X is selected from the group consisting of Cr, Mo and W, and
       Y is selected from the group consisting of Se, S, O and Te;
    c) a memory element;
    d) a word line, and
    wherein the $M_a X_b Y_2$ layer and the memory element are: (i) between the bit line and the word line, and (ii) in electrical series with the word and bit lines.

11. The method of claim 10, wherein the $M_a X_b Y_2$ layer is $Cu_a Cr_b S_2$, where a=0.4 to 1.2 and b=0.8 to 1.2.

12. The method of claim 10, wherein the $M_a X_b Y_2$ layer is $Cu_{0.24 \pm 0.005} Cr_{0.26 \pm 0.005} S_{0.5 \pm 0.01}$.

13. The method of claim 1, the method further comprising:
    forming a semiconductor memory device that includes the first contact electrode, the semiconductor memory device comprising:
    a) a bit line;
    b) a $M_8 X Y_6$ layer, wherein
       X includes at least one of Ge, Si, Sn, and C,
       Y includes at least one of Se, S, O, and Te, and
       M comprises one or a plurality of elements $M_{a1}$ ... $M_{an}$, and $a_1 + \ldots + a_n = 8$, wherein M includes at least one of Cu, Ag, Li, and Zn;
    c) a memory element;
    d) a word line, and wherein the $M_8XY_6$ layer and the memory element are: (i) between the bit line and the word line, and (ii) in electrical series with the word and bit lines.

14. The method of claim 13, wherein the $M_8XY_6$ layer is one of: $Cu_8GeS_6$, $Cu_8GeSe_6$ or $Ag_{4.7}Cu_{3.3}GeS_6$.

15. A device, comprising:
   a first material layer with a composition of one of: $M_aX_bY_2$ or $M_8XY_6$; and
   a first contact electrode with a first side that is opposite a second side, wherein the first side abuts the first material layer, wherein the first contact electrode has a stoichiometry that varies from the first side to the second side, and wherein the stoichiometry of the first side inhibits the diffusion of metal from the first material layer into the first contact electrode.

16. The device of claim 15, the device further comprising:
   a bit line;
   a memory element; and
   a word line, wherein the first material layer and the memory element are: (i) between the bit line and the word line, and (ii) in electrical series with the word and bit lines.

17. The device of claim 15, wherein
for $M_aX_bY_2$:
   a=0.4 to 1.2, b=0.8 to 1.2,
   M is selected from the group consisting of Cu, Ag, Li and Zn,
   X is selected from the group consisting of Cr, Mo and W, and
   Y is selected from the group consisting of Se, S, O and Te.

18. The device of claim 15, wherein
for $M_8XY_6$:
   X includes at least one Group XIV element,
   Y includes at least one Group XVI element, and
   M comprises either one or a plurality of elements $M_{a1}$ ... $M_{an}$, and $a_1+ \ldots +a_n=8$, wherein M includes at least one element selected from the group consisting of Cu, Ag, Li, and Zn.

19. The device of claim 15, wherein the device comprises a cross-point memory array that operates reliably at a current density greater than $5\times10^6$ A/cm² and has a voltage margin greater than 1 V.

20. A method of reading a memory element, the method comprising:
   applying voltage to the device of claim 16, thereby changing the state of the memory element; and
   reading-out the state of the memory element, wherein the state that is read-out is the resistance of one of the memory elements.

* * * * *